United States Patent
Lai

(10) Patent No.: US 6,804,115 B2
(45) Date of Patent: Oct. 12, 2004

(54) HEAT DISSIPATION APPARATUS

(75) Inventor: Chih-Hsi Lai, Hsin Tien (TW)

(73) Assignee: Quanta Computer Inc., Taoyuan Shien (TW)

( * ) Notice: Subject to any disclaimer, the term of this patent is extended or adjusted under 35 U.S.C. 154(b) by 44 days.

(21) Appl. No.: 10/361,513

(22) Filed: Feb. 11, 2003

(65) Prior Publication Data
US 2004/0105233 A1 Jun. 3, 2004

(30) Foreign Application Priority Data
Nov. 28, 2002 (TW) ........................ 91134677 A

(51) Int. Cl.⁷ ............................................. H05K 7/20
(52) U.S. Cl. ..................... 361/695; 165/80.3; 165/121; 165/104.33; 165/104.34; 361/700; 361/701; 361/696; 454/184
(58) Field of Search ................ 165/80.3, 121, 165/122, 185, 104.33–104.34; 361/687–707; 454/184; 174/15.2

(56) References Cited

U.S. PATENT DOCUMENTS

| | | | |
|---|---|---|---|
| 5,806,583 A | * 9/1998 | Suzuki et al. | 165/104.33 |
| 6,131,647 A | * 10/2000 | Suzuki et al. | 165/104.33 |
| 6,650,540 B2 | * 11/2003 | Ishikawa | 361/695 |
| 6,657,859 B1 | * 12/2003 | Karr | 361/687 |
| 6,674,640 B2 | * 1/2004 | Pokharna et al. | 361/687 |
| 6,712,129 B1 | * 3/2004 | Lee | 165/104.21 |

* cited by examiner

Primary Examiner—Gregory D. Thompson
(74) Attorney, Agent, or Firm—Rabin & Berdo, P.C.

(57) ABSTRACT

A heat dissipation apparatus is described. The heat dissipation apparatus is used in an electrical product, and especially in a notebook computer. The heat dissipation apparatus has two cooling fans, at least one heat pipe, and at least two heat dissipation fins. The first fan sucks cooling air from outside of the electrical product. The heat pipe coupling with a heat source transfers heat generated by the heat source to the heat dissipation fins. The first heat dissipation fin and the first fan remove part of the heat out of the electrical product. The second heat dissipation fin further connects with the heat source and the heat pipe to utilize the second fan to remove part of the heat exhausted by the first fan from the electrical product. The heat dissipation apparatus further comprises a third heat dissipation fin and a second heat pipe. The second heat pipe efficiently transfers the heat to each of the heat dissipation fins. The third heat dissipation fin is positioned in an outlet of the second fan to exchange heat again and thus enhance the heat dissipation efficiency.

16 Claims, 2 Drawing Sheets

HEAT DISSIPATION APPARATUS

FIELD OF THE INVENTION

The present invention relates to a heat dissipation apparatus and especially to enhancing efficiency of the heat dissipation apparatus for a notebook computer.

BACKGROUND OF THE INVENTION

Information technology and the computer industry are highly developed now. Portable electronic devices, such as a notebook computer, are widely used. Due to weight and practical requirements, portable devices tend to be lighter, thinner, shorter or smaller. The notebook computer is a successful product because the notebook computer with powerful calculation capability deals with a great amount of digital data.

Because the semiconductor manufacture process has highly progressed and functional requirements of the semiconductor are highly intense, the electric circuit layout of the semiconductor becomes more complicated and more sophisticated. For example, an electric circuit layout of a new generation central processing unit (CPU) is more complicated because the new generation CPU has to provide more powerful functions for users and application software. The new generation CPU provides powerful functions and performance but more powerful CPU generates more new problems in use. A serious problem is that the new generation CPU with a complicated circuit has a higher power consumption and thus severely elevates the working temperature of the chips. The high working temperature can cause instability in a working system, and especially in a small-sized portable device. In general, a lower working temperature makes a portable device more stable. That is to say, if the working temperature of a notebook computer can be kept lower, the performance thereof is higher. Nevertheless, if the working temperature is too high, the performance and stability will decrease and the operation system may even crash, in some extreme situations.

Conventionally, a heat dissipation device mounted on a new generation CPU with high power consumption exhausts the heat generated by the new generation CPU directly. The fan of the heat dissipation device blows on the heat dissipation fin mounted on the CPU to exhaust the heat of the CPU out of the notebook computer. Due to the heat dissipation device usually being installed inside the notebook computer, the inlet temperature of the fan of the heat dissipation device normally is higher than the outside temperature of the notebook computer. Sometimes, the inlet temperature of the fan is higher than 50 degrees Celsius. Therefore, the efficiency of the heat dissipation device decreases.

The efficiency of the heat dissipation device can be enhanced if the inlet air directly sucks air from outside of the notebook computer. But, even though sucking outside air into the inlet enhances the efficiency of the heat dissipation device of the CPU, the total heat dissipation efficiency of the whole notebook computer still is low. Therefore, the notebook computer still needs a fan dedicated to exhausting internal system heat of the notebook computer. Therefore, there is a need to enhance the total heat dissipation efficiency of the notebook computer.

SUMMARY OF THE INVENTION

One object of the present invention is to provide a heat dissipation apparatus utilizing exterior fresh air for reducing the CPU surface temperature.

Another object of the present invention is to provide a heat dissipation apparatus having a cooling fan whose inlet is isolated from the internal air of the notebook computer to enhance the CPU heat dissipation efficiency.

A further object of the present invention is to utilize multiple heat exchanges for enhancing the total heat dissipation efficiency of the notebook computer.

The present invention provides a heat dissipation apparatus for an electrical product, such as a desktop computer, a notebook computer, or a portable electrical product. The heat dissipation apparatus comprises two cooling fans, at least one heat pipe, and at least two dissipation fins.

The first fan includes an inlet, a first outlet and a second outlet. The inlet sucks cooling air from outside of the electrical product by way of a first opening on the electrical product cover. The first heat pipe includes two ends. The first end of the first heat pipe connects with the heat source to transfer heat generated by the heat source, such as a CPU, to the first fan. The first heat dissipation fin is connected to the second end of the first heat pipe. Meanwhile, the first end of the first heat dissipation fin couples with the first outlet of the first fan and the second end of the first heat dissipation fin couples with a second opening on the electrical product cover.

The second heat dissipation fin connects with the first heat pipe and the heat source. Meanwhile, the first end of the second heat dissipation fin couples with the second outlet of the first fan. Therefore, the first heat pipe transfers a part of the heat to the first heat dissipation fin and another part of the heat to the second heat dissipation fin. The second fan connects with the second end of the second heat dissipation fin to suck out exhaust air blowing from the second outlet of the first fan. The exhaust air goes through the second heat dissipation fin to exchange heat and then drains out the electrical product.

The heat dissipation apparatus further comprises a third heat dissipation fin and a second heat pipe. The third heat dissipation fin is positioned at an outlet of the second fan to exchange heat again with the exhaust air and then the exhaust air is drained out the electrical product. The second heat pipe connects with the first heat dissipation fin, the second heat dissipation fin, the third heat dissipation fin and the heat source to transfer a further part of the heat generated by the heat source to the first heat dissipation fin, the second heat dissipation fin, and the third heat dissipation fin.

The second fan further sucks out internal air of the electrical product and mixes the same with the exhaust air exchanged heat with the second heat dissipation fin and then the mixed air drains out the electrical product.

Therefore, the heat dissipation apparatus according to the present invention can reduce the CPU surface temperature, the internal system temperature, and further enhance the heat dissipation efficiency of the electrical product. The electrical product with the heat dissipation apparatus according to the present invention can save the power consumption and increase the efficiency thereof.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
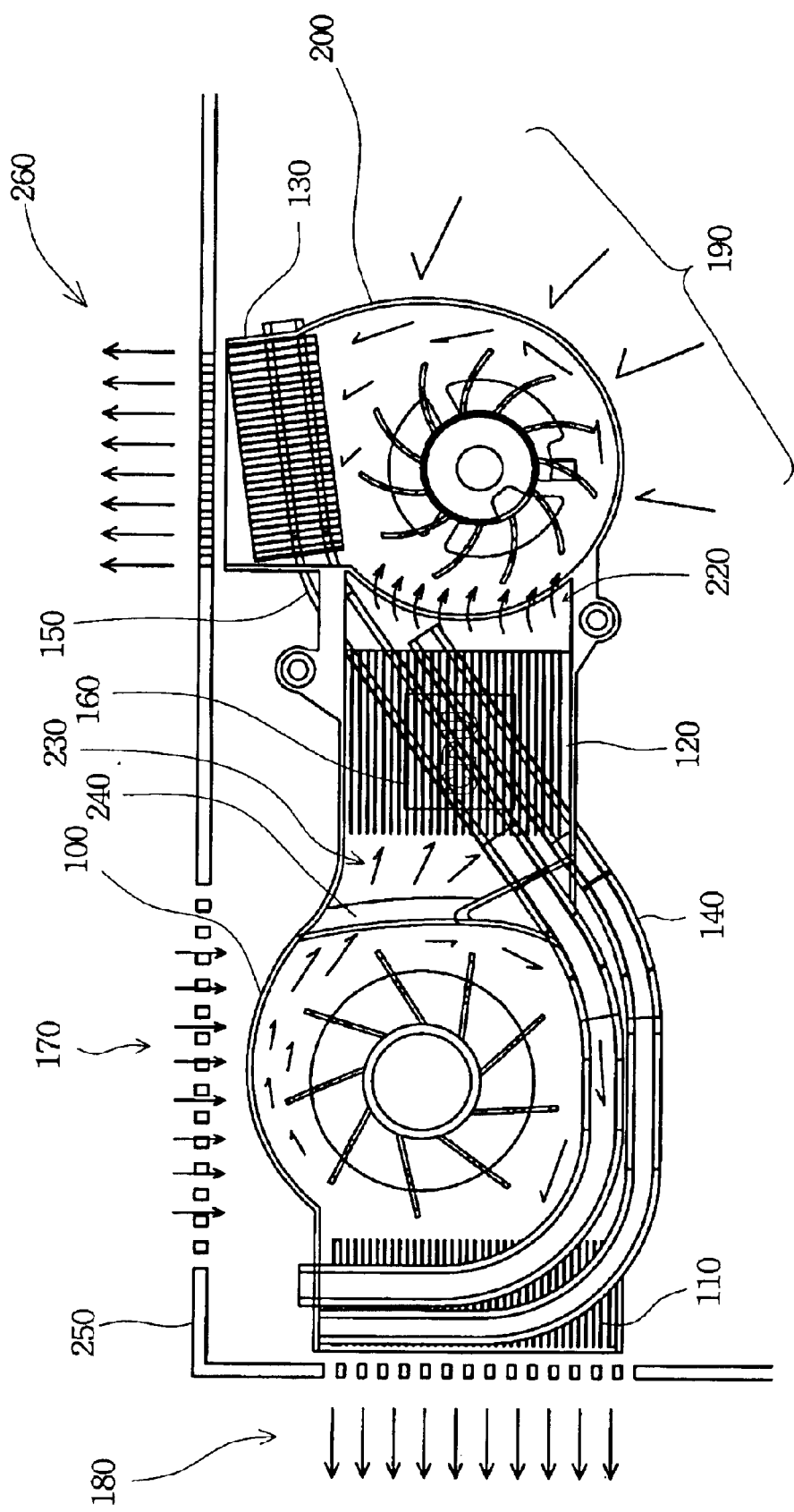
FIG. 1 is a schematic top view of a preferred embodiment of a heat dissipation apparatus according to the present invention.
Figure 2:
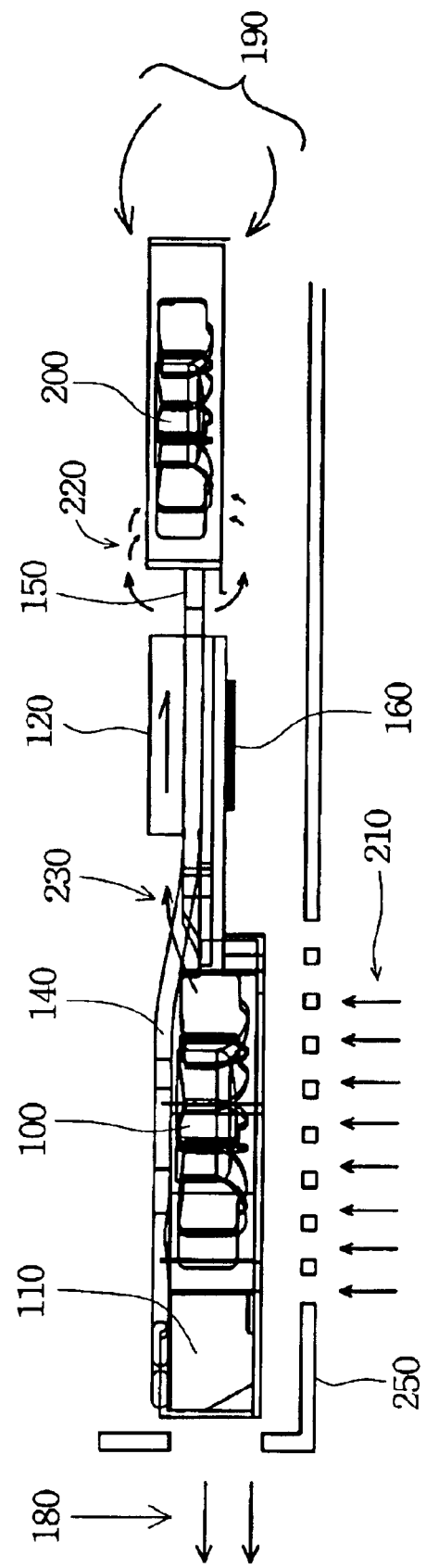
FIG. 2 is a schematic side view of the preferred embodiment of FIG. 1.

FIG. 1 is a schematic top view of a preferred embodiment of a heat dissipation apparatus according to the present invention. FIG. 2 is a schematic side view of the preferred embodiment of FIG. 1. The heat dissipation apparatus according to the present invention includes a first fan 100, a second fan 200, a first heat dissipation fin 110, a second heat dissipation fin 120, and a third heat dissipation fin 130. A heat impedance is closely linked with a CPU surface temperature, $T_{CPU}$, an ambient temperature, $T_{AMB}$, and an internal system temperature, $T_{SYS}$. The relationship between them is described by the following equation:

$$\text{Heat Impedance} = (T_{CPU} - T_{AMB} - T_{SYS})/W \quad \text{(Eq. 1)}$$

where W is the power, Watt, of the heat source, such as the CPU.

The heat efficiency of the fan can be increased if the heat impedance between the heat source, such as the CPU, and the ambiance is reduced. Since low ambient temperature $T_{AMB}$ or low system temperature $T_{SYS}$ generates low $T_{CPU}$, according to Eq. 1, the lower heat impedance should have a lower ambient temperature or a lower system temperature. Both of them can enhance the heat dissipation efficiency of the fan.

Referring to FIG. 1 and FIG. 2, the embodiment of the heat dissipation apparatus according to the present invention is installed in a notebook computer. The first fan 100 directly sucks cool air from outside of the notebook computer to increase the heat dissipation efficiency thereof. The first fan 100 includes two inlets; the first inlet sucks cool air 170 from the sidewall of the notebook computer cover 250 and the second inlet sucks cool air 210 from the bottom side of the notebook computer shell 250. Because the entering cool air of the first fan 100 is all from outside of the notebook computer, the first fan 100 sucks in no internal air from the inside of the notebook computer. Therefore, the internal temperature, $T_{SYS}$, of the notebook computer has no influence on the heat impedance according to the Eq. 1. That is to say, the heat efficiency increases because that the $T_{SYS}$ is zero in Eq. 1. The efficiency of the heat dissipation device for the CPU therefore increases.

The heat dissipation apparatus according to the present invention further utilizes outlet 180 and 240 to exhaust air. Outlet 180 exhausts the air heated by the first heat dissipation fin 110 and the heated air is exhausted directly out of the notebook computer. The outlet 240 blows part of air 230 to the second heat dissipation fin 120 directly mounted on the heat source, such as the CPU 160, or the conductive metal element connected to the heat source. The air 230 removes part of the heat generated by the CPU 160 by way of heat exchange on the second heat dissipation fin 120. The heat on the first heat dissipation fin 110 is delivered by the first heat pipe 140 and the second heat pipe 150 which transfer part of the heat generated by the CPU 160 thereto. The first fan 100 blows the heat in the first heat dissipation fin 110 directly out of the notebook computer by way of the outlet 180.

The air 230 exhausted by the outlet 240 goes through the second heat dissipation fins 120 to remove part of the heat generated by the CPU 160 and then enters inlet 220 of the second fan 200. The second fan 200 sucks in not only the air 230 from the inlet 220 but also internal air 190 from inside the notebook computer. Therefore, another portion of the heat generated by the CPU 160 moves out of the notebook computer by way of heat exchange on the second heat dissipation fin 120 and the outlet 260 of the second fan 200. In front of the outlet 260, the mixture of air 230 and air 190 pass through a third heat dissipation fin 130 to remove a further portion of heat generated by the CPU 160. The heat dissipation apparatus according to the present invention further utilizes the second heat pipe 150 to deliver the further portion of heat generated by the CPU 160 to the third heat dissipation fin 130 for one more heat exchange with the exhaust air and then the exhaust air exhausts out of the notebook computer. Therefore, the heat dissipation apparatus according to the present invention utilizes a plurality of heat exchanges to utilize fully the cooling capacity of the first fan 100 and the second fan 200 so as to reduce the surface temperature of CPU 160 and to decrease efficiently the internal system temperature of the notebook computer. Therefore, the present invention further increases the total heat dissipation efficiency of the notebook computer and the cooling capacities of the fans. Accordingly, the present invention reduces the power consumption of the fans for the notebook computer so that the notebook computer may save more power and the noise caused by the fan is furthermore reduced.

The heat dissipation according to the present invention utilizes a cooling fan sucks cool air directly from outside the system to move the heat generated by the CPU, and therefore the CPU surface temperature is efficiently reduced. Further, the heat dissipation apparatus according to the present invention utilizes a second cooling fan to reduce the CPU surface temperature and also to move the heat generated by the internal system of the notebook computer. Therefore, the heat dissipation efficiency of the internal system is increased. The heat dissipation apparatus according to the present invention combines a plurality of heat exchanges with a plurality of heat dissipation fins to exhaust efficiently the heat generated by the CPU and the system of a notebook computer. Hence, the heat dissipation apparatus according to the present invention may use a smaller cooling fan for removing the heat of the notebook computer and still maintain good heat dissipation. The present invention can be used not only in a notebook computer but also in any type of electrical product which needs a heat dissipation apparatus to remove heat energy generated by a heat source. As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation apparatus used in an electrical product having a heat source, the heat dissipation apparatus comprising:

a first fan including an inlet, a first outlet and a second outlet, the inlet sucking in cooling air from outside the electrical product via a first opening in a cover of the electrical product;

a first heat pipe, a first end of the first heat pipe connecting with the heat source to transfer heat generated by the heat source to the first fan;

a first heat dissipation fin connecting a second end of the first heat pipe, a first end of the first heat dissipation fin coupling with the first outlet of the first fan and a second end of the first heat dissipation fin coupling with a second opening of the cover of the electrical product;

a second heat dissipation fin connecting with the first heat pipe and the heat source, a first end of the second heat dissipation fin coupling with the second outlet of the first fan, wherein the first heat pipe transfers part of the heat to the first heat dissipation fin and part of the heat to the second heat dissipation fin; and a second fan connecting with a second end of the second heat dissipation fin to suck out exhaust air blowing from the second outlet of the first fan, the exhaust air passing over the second heat dissipation fin to exchange heat and then draining out the electrical product.

2. The heat dissipation apparatus of claim 1, wherein the heat dissipation apparatus further comprises:

a third heat dissipation fin positioned in an outlet of the second fan, the exhaust air exchanging heat again with the third heat dissipation fin and then draining out the electrical product; and a second heat pipe connecting with the first heat dissipation fin, the second heat dissipation fin, the third heat dissipation fin and the heat source to transfer a further part of the heat generated by the heat source to the first heat dissipation fin, the second heat dissipation fin, and the third heat dissipation fin.

3. The heat dissipation apparatus of claim 1, wherein the second fan further sucks out internal air of the electrical product to be mixed with the exhaust air exchanged heat with the second heat dissipation fin and then drained out the electrical product.

4. The heat dissipation apparatus of claim 1, wherein the inlet of the first fan is positioned in a sidewall and bottom cover of the electrical product.

5. The heat dissipation apparatus of claim 1, wherein the heat source is an integrated circuit device.

6. The heat dissipation apparatus of claim 1, wherein the second fan is a fan with a double side sucking inlet or a single side sucking inlet.

7. The heat dissipation apparatus of claim 1, wherein the second heat dissipation fin is positioned on the heat source and the first heat pipe so as to transfer part of the heat to the second heat dissipation fin directly.

8. A heat dissipation apparatus utilizing in an electrical product, the heat dissipation apparatus comprising:

a first fan including an inlet, a first outlet and a second outlet, the first fan sucking in air from outside the electrical product by way of the inlet and exhausting the air to the first outlet and the second outlet;

a first heat pipe, a first end of the first heat pipe connecting with a heat source of the electrical product to transfer heat generated by the heat source to the first outlet of the first fan;

a first heat dissipation fin connecting a second end of the first heat pipe, a first end of the first heat dissipation fin coupling with the first outlet of the first fan and a second end of the first heat dissipation fin coupling with an opening in a cover of the electrical product;

a second heat dissipation fin connecting with the first heat pipe, a first end of the second heat dissipation fin coupling with the second outlet of the first fan, wherein the first heat pipe transfers part of the heat to the first heat dissipation fin and part of the heat to the second heat dissipation fin; and a second fan including an inlet and an outlet, the inlet of the second fan connecting with a second end of the second heat dissipation fin to suck out exhaust air passing over the second heat dissipation fin and then draining out the electrical product by way of the outlet of the second fan.

9. The heat dissipation apparatus of claim 8, wherein the heat dissipation apparatus further comprises:

a third heat dissipation fin positioned in the outlet of the second fan, the exhaust air exchanging heat again with the third heat dissipation fin and then draining out the electrical product; and a second heat pipe connecting with the first heat dissipation fin, the second heat dissipation fin, the third heat dissipation fin and the heat source to transfer part of the heat generated by the heat source to the first heat dissipation fin, the second heat dissipation fin, and the third heat dissipation fin.

10. The heat dissipation apparatus of claim 8, wherein the second fan further sucks internal air of the electrical product to mix with the exhaust air exchanged heat with the second heat dissipation fin and then drain out the electrical product.

11. The heat dissipation apparatus of claim 8, wherein the inlet of the first fan is positioned in a bottom cover of the electrical product.

12. The heat dissipation apparatus of claim 8, wherein the inlet of the first fan is a second opening in the cover of the electrical product.

13. The heat dissipation apparatus of claim 8, wherein the heat source is an integrated circuit device.

14. The heat dissipation apparatus of claim 8, wherein the second fan is a fan with double side sucking inlet or a single side sucking inlet.

15. The heat dissipation apparatus of claim 8, wherein the second heat dissipation fin is positioned on the heat source and the first heat pipe so as to transfer part of the heat to the second heat dissipation fin directly.

16. The heat dissipation apparatus of claim 8, wherein the heat generated by the heat source drains out of the electrical product by way of the first heat pipe, the second heat pipe and the second heat dissipation fin cooperative.

* * * * *